United States Patent
Robert (10) Patent No.: US 8,716,052 B2
(45) Date of Patent: May 6, 2014

(54) METHOD FOR MAKING A STRUCTURE COMPRISING AT LEAST ONE MULTI-THICK ACTIVE PART

(71) Applicant: Commissariat a l'energie atomique et aux energies alternatives, Paris (FR)

(72) Inventor: Philippe Robert, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 13/688,746

(22) Filed: Nov. 29, 2012

(65) Prior Publication Data
US 2013/0137245 A1    May 30, 2013

(30) Foreign Application Priority Data
Nov. 30, 2011   (FR) ...................... 11 60972

(51) Int. Cl.
*H01L 21/00*    (2006.01)
(52) U.S. Cl.
USPC ....... 438/53; 257/E21.214; 257/419; 438/478
(58) Field of Classification Search
USPC ................. 257/21.214, 419; 438/53, 478
See application file for complete search history.

(56) References Cited

U.S. PATENT DOCUMENTS

| 7,494,839 | B2 | 2/2009 | Benzel et al. |
| 2004/0065931 | A1 | 4/2004 | Benzel et al. |
| 2005/0181529 | A1 | 8/2005 | Benzel et al. |
| 2008/0026134 | A1 | 1/2008 | Kayama |
| 2011/0147864 | A1 | 6/2011 | Kramer et al. |

FOREIGN PATENT DOCUMENTS

DE   10 2006 007 729 A1   8/2007

OTHER PUBLICATIONS

U.S. Appl. No. 13/682,847, filed Nov. 21, 2012, Robert, et al.
French Preliminary Search Report issued Apr. 19, 2012, in Patent Application No. FR 1160972, filed Nov. 30, 2011 (with English Translation of Category of Documents).
Ph. Robert, V. Nguyen, et al., "M&NEMS : A new approach for ultra-low cost 3D inertial sensor", IEEE Sensors, XP 55023740, Oct. 1, 2009, pp. 963-966.

*Primary Examiner* — Asok K Sarkar
(74) *Attorney, Agent, or Firm* — Oblon, Spivak, McClelland, Maier & Neustadt, L.L.P.

(57) ABSTRACT

A method for making a structure comprising an active part comprising at least two layers from a first single crystal silicon substrate, said method comprising the steps of:
a) making at least one porous silicon zone in the first substrate,
b) making an epitaxial growth deposition of a single crystal silicon layer on the entire surface of the first substrate and the surface of the porous silicon zone,
c) machining the epitaxially grown single crystal layer at the porous silicon zone to make a first suspended zone,
d) removing or oxidizing the porous silicon,
e) depositing a sacrificial layer being selective towards silicon,
f) machining the first substrate,
g) releasing the suspended zones by withdrawing the sacrificial layer.

27 Claims, 7 Drawing Sheets

METHOD FOR MAKING A STRUCTURE COMPRISING AT LEAST ONE MULTI-THICK ACTIVE PART

TECHNICAL FIELD AND PRIOR ART

The present invention relates to a method for making a structure comprising at least one multi-thickness active part that can be implemented in making microelectromechanical (MEMS) and/or nanoelectromechanical (NEMS) systems for making, for example, sensors or actuators.

The MEMS and NEMS sensors comprise a fixed part and at least one part suspended with respect to the fixed part, the one or more suspended parts called the "active parts" are able to be displaced and/or deformed under the effect of an external action, such as a mechanical, electrical, magnetic action.

The displacement and/or deformation of the movable part with respect to the fixed part enable, for example, an acceleration in the case of an accelerometer, or a Coriolis force in the case of a gyrometer to be determined. The displacement of the movable part is for example measured by means of strain gauges.

The paper Ph. Robert, V. Nguyen, S. Hentz, L. Duraffourg, G. Jourdan, J. Arcamone, S. Harrisson, *M&NEMS: A new approach for ultra-low cost 3D inertial sensor, IEEE SENSORS 2009 Conference—25-28 October 2009—Christchurch New Zealand*, (2009) describes a MEMS & NEMS structure forming an in-plane accelerometer. The structure comprises an active part formed with two distinct active thicknesses: the NEMS part forming a strain gauge comprises one of these active thicknesses, and the MEMS part forming a seismic mass comprises the two active thicknesses.

The method for making such an active part is made from a SOI ("Silican on Insulator") type substrate which has a high cost price. Furthermore, a thick epitaxial growth step is implemented, such a step is generally long and expensive. The strain gauge is formed from the SOI substrate and the seismic mass is formed from the SOI substrate and the thick epitaxially formed layer.

On the other hand, the step of defining the active part implements an oxide layer on which the epitaxial growth will partly occur.

However, the layer epitaxially formed on the oxide layer is not a single crystal one in the interface zones between both thicknesses, which were protected by the oxide layer. These "polycrystalline" zones can generate faults in the structure.

Furthermore, the epitaxial growth rate is different between the zones where the growth is made on the single crystal silicon and the zones where the growth is made on the oxide layer for example, which forms the interface of both thicknesses. This difference in growth rate can result in high thickness inhomogeneities in the final structure.

This structure inhomogeneity problem due to the presence of polycrystalline zones in single crystal layers and of thickness inhomogeneity is all the more problematic in the case where more than two distinct layers or interface zones between two high area layers are desired to be available.

DISCLOSURE OF THE INVENTION

It is therefore an object of the present invention to provide a method for making a structure comprising an active part formed by several layers at least one of which is of single crystal semi-conductor material having a lower cost and which is quicker than methods using a SOI substrate.

The object of the present invention is achieved by a method for making a structure provided with a multilayer active part, comprising a step of epitaxially growing a single crystal semi-conductor material on a substrate, at least the face thereof on which the epitaxy is performed being of single crystal semi-conductor material, the substrate comprising at least one zone wherein the semi-conductor material is discontinuous.

In the present application, by "zone wherein the semi-conductor material is discontinuous", it is meant a zone formed either by a porous material, or a plurality of thin pillars of semi-conductor material and provided a short distance apart from each other.

The step of epitaxy is used to form the first active layer similar to that formed from a SOI substrate. This first layer is generally of low thickness. The second active layer, generally thicker than the first one, is in turn advantageously formed by all or part of the "bulk" part of the first substrate after bonding a second substrate, whereas in the known method using a SOI substrate, this second active layer is epitaxially formed. The drawbacks related to a thick epitaxy are thus avoided.

Thanks to the invention, the epitaxially grown layer, which is a single crystal one, grows on a porous layer which can be withdrawn selectively with respect to the epitaxial by grown layer, and consequently the porous layer acts as a sacrificial layer.

Furthermore, thanks to the epitaxy growth on the discontinuous semi-conductor material, the occurrence of polycrystalline zones at the interfaces does not happen and the growth rates are substantially uniform between the discontinuous semi-conductor material and the single crystal semi-conductor material of the substrate.

Since the making method according to the invention does not require using a SOI substrate and does not implement a thick epitaxy, this results in a production cost and time gain. Besides, as the thickness inhomogeneities are reduced, it is not necessary to have a step of chemical-mechanical polishing which is important to make up for the thickness differences.

Very advantageously, in the embodiment of a porous zone, this comprises very small size pores on the surface, which improves the silicon quality which epitaxially grows on this porous zone, greater size pores in depth, which affords a selective etching or a quicker oxidation.

The subject-matter of present invention is therefore to provide a method for making a structure comprising an active part comprising at least two layers from a first substrate comprising a first face of single crystal semi-conductor material, called the front face, and a second face opposite the first face, called the back face, said method comprising the steps of:

a) making at least one zone of discontinuous semi-conductor material in the first substrate from the front face of single crystal semi-conductor material, b) making an epitaxial growth deposition of a layer from a semi-conductor material onto the front face of the first substrate, said layer being at least a single crystal one on the surface of the zone of discontinuous semi-conductor material, c) machining the epitaxially grown single crystal layer at least at the zone of discontinuous semi-conductor material to make a first suspended zone, d) removing or oxidizing the discontinuous semi-conductor material, e) forming a sacrificial layer being selectively etchable with respect to said semi-conductor material of the front face and to the material of the epitaxially grown semi-conductor layer, f) machining the back face of the first substrate up to clear some zones from said sacrificial layer to make a second suspended zone and to enable the first suspended zone to be reached, g) releasing the first and second suspended zones by withdrawing at least one part of the sacrificial layer.

During step e), the formation of the sacrificial layer occurs at least on the front face and results in completely or partly coating the first suspended zone.

The step of epitaxial growth can be made in the same material as the semi-conductor material of the front face of the first substrate or in another semi-conductor material having preferably a lattice parameter close to that of the material of said face.

The formation of the sacrificial layer is for example achieved by depositing an oxide and/or by thermal oxidation. The method can advantageously comprise after step e) and before step f), a step e') of bonding or depositing a second substrate onto the front face of the first substrate.

In a first embodiment, during step a), a zone of porous semi-conductor material is made. The zone of porous semi-conductor material is achieved by electrochemical etching.

In an advantageous example, the zone of porous semi-conductor material comprises smaller size pores on the surface and greater size pores in depth.

During step d), the removal of the porous semi-conductor material can be made by etching, for example by wet etching, or by thermal oxidation of the porous semi-conductor material and by etching the oxidized porous semi-conductor material, for example by wet etching and/or vapour.

In another embodiment, during step a), a zone of semi-conductor material is made comprising a plurality of small cross-sectional area pillars and provided a short distance a part from each other. Step a) can comprise:

a step of forming a mask bounding pillars,
a step of etching interpillar zones,
a step of withdrawing the mask.

In this embodiment, the removal of the semi-conductor material forming pillars during step d) is achieved by annealing at a temperature close to the melting temperature of said material.

Preferentially, the method comprises, prior to step e'), a step of structuring the second substrate. For example, during the structuration step, a face of the second substrate is etched so as to make mechanical stops for the second suspended part and a deposition is performed on said structured face of a layer intended to form a bonding layer during the bonding step of the second substrate.

According to an additional characteristic, the method can comprise, following step e), the step of structuring the sacrificial layer and/or depositing one or more intermediate layers on said sacrificial layer, wherein said intermediate layers can be structured. The structurations of the sacrificial layer and the one or more intermediate layers can be made, for example, by lithography and etching respectively of the sacrificial layer with stop on the substrate and the one or more intermediate layers with stop on the sacrificial layer.

The method can comprise a step of depositing a $SiO_2$ layer, planarizing on the structured sacrificial layer and/or the one or more intermediate layers, said $SiO_2$ layer taking part in the bonding.

The bonding of the first and second substrates is achieved by direct bonding or eutectic bonding.

According to an example, the first substrate is structured before step a).

After step e'), the first substrate and/or the second substrate can be thinned down by back-grinding the back face, and then chemical-mechanical polishing.

The method can comprise prior to step a), a step of forming on the front face of the substrate a porous semi-conductor layer and epitaxially growing on said porous semi-conductor layer a single crystal semi-conductor layer, sais single crystal semi-conductor layer forming the front face from which the discontinuous porous zone is formed. Following the bonding, the porous semi-conductor layer for example is etched so as to thin down the first substrate.

In the first embodiment, several zones of porous semi-conductor material can be made, the latter having different depths.

Step f) of machining for making a second suspended zone and machining to afford the first suspended zone can be achieved by simultaneously machining the first substrate at said zones or by successively machining at each of these zones.

In order to make an active part having more than two layers, steps a) to e) are repeated.

The semi-conductor material of the front face of the first substrate, the second substrate and the layer made by epitaxy are preferably of silicon.

The method can advantageously make microelectronical and/or nanoelectromechanical structures to make sensors and/or actuators.

BRIEF DESCRIPTION OF THE DRAWINGS

The present invention will be better understood using the following description and the appended drawings wherein.

DETAILED DESCRIPTION OF PARTICULAR EMBODIMENTS

In FIGS. 1A to 1H, the steps of a first embodiment of a method according to the present invention for making a structure comprising an active part formed by several layers, at least one of which is of single crystal semi-conductor material can be seen.

In the present application, by "active part" of a MEMS and/or NEMS structure, it is meant a suspended part, likely to be displaced and/or deformed under the effect of an external (mechanical, electrical, magnetic, . . . ) action.

In the description that follows and for the sake of simplicity, the example of silicon will be used as a semi-conductor material. It is worth of note that the implementation of any other semi-conductor material does not depart from the scope of the present invention.

The method according to the first embodiment comprises the following main steps from a bulk type silicon substrate:
- a) making one or more porous silicon zones on all or part of this substrate,
- b) making a silicon or single crystal SiGe epitaxy on the entire surface of the substrate and on the surface of the porous silicon,
- c) machining the silicon or SiGe layer epitaxially grown to define the shape of the first suspended zone in the first thickness of the single crystal silicon and locally open the portion of porous silicon,
- d) totally or partly withdrawing the porous silicon, or thermal oxidizing the porous Si,
- e) depositing and/or thermally oxidizing a sacrificial layer selective towards silicon,
- f) machining the first substrate up to clear some zones from the sacrificial layer and/or all or part of the porous silicon zones to make a second suspended zone and clear all or part of the first suspended zone,
- g) releasing the suspended zones by withdrawing the sacrificial layer.

Advantageously, between step e) and f) is provided a step e') of transferring or depositing a support onto the back face of the first substrate thus structured.

Steps a) to g) of the method will now be described in detail.

The method according to the invention advantageously uses a first substrate 2 of single crystal silicon.

During first step a), a mask 4 is made on the surface of the substrate 2 by depositing a layer about 100 nm thin. This layer 4 is for example of silicon nitride.

A step of lithography then occurs on the layer 4 for bounding the zones of the layer 2 to be etched and a step of etching the layer 4 occurs, uncovering a zone 6 of the substrate 2.

During a following step, the zone 6 is made porous on a given thickness, for example by porosification through electrochemical etching. This etching is an etching over time. The thickness of the silicon made porous is between 0.1 µm and 10 µm, advantageously, it is equal to about 1 µm.

Figure 1A:
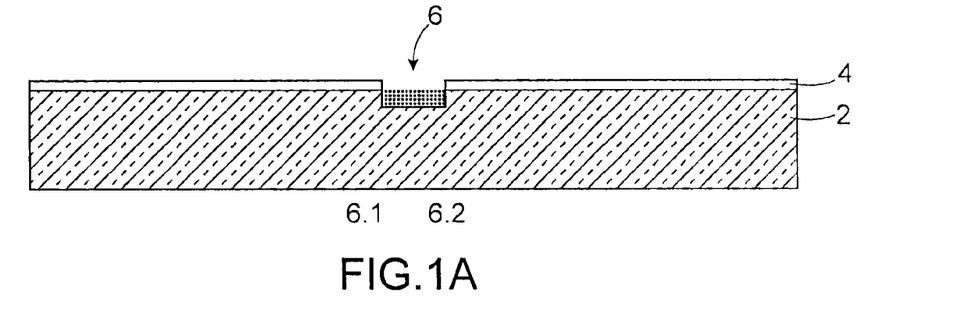
FIGS. 1A to 1H are schematic representations of different steps of a method for making a structure having an active part according to a first embodiment.

The element schematically represented in FIG. 1A is obtained, the portion of porous silicon is designated by reference 8.

Making one or more porous portions is within the scope of the present invention and depends on the structure to be made.

Particularly advantageously, the porous portion 6 comprises pores 6.1 having a very small size on the surface, which improves the quality of the silicon which will be epitaxially grown on this porous portion, and pores 6.2 having a greater size in depth, which affords a selective etching or a quicker oxidation of the porous silicon. This porous portion having different pore sizes can be obtained by changing the electrochemical etching conditions during the porosification step, for example by changing the current density. For example, the pore size wanted is between 2 and 50 nm, the obtained material is then of the mesoporous type.

During a following step, the mask 4 is withdrawn, for example by chemical etching of the silicon nitride.

Then occurs a step b) of epitaxially growing a silicon or SiGe layer 10, this layer is a single crystal one above the porous portion 6 and can be a single crystal one or polycrystalline on the entire rest of the substrate surface. The silicon or polycrystalline Si—Ge can be obtained by depositing, for example an oxide or nitride layer at the surface of the substrate before epitaxy. The thickness of the layer 10 is between a few tens nm and a few tens advantageously it is equal to about 0.25 µm.

The layer 10 can be of a semi-conductor material identical to that of the first substrate or of another semi-conductor material having preferably a lattice parameter close to that of the material of the first substrate. For example, as described above, in the case of a first Si substrate, a Si or SiGe epitaxy is for example carried out.

For the sake of clarity, in the schematic representations of the different steps, the layer 10 and the substrate 2 are separated by a dotted line.

Figure 1B:
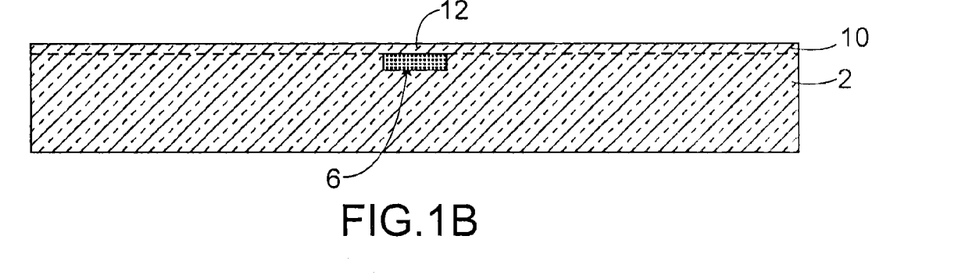

The element thus obtained is represented in FIG. 1B. The silicon portion 12 formed above the porous zone 6 will be etched to form a first suspended zone 14.

During a following step c), the first suspended zone 14 is defining. For this, a lithography occurs to make a mask on the surface of the layer 10 and then an etching of the portion 12 with stop on or in the portion of porous silicon 6 is carried out.

The etching is for example a deep reactive-ion etching (DRIE).

The first suspended zone 14 forms the NEMS part in the case of a so-called M&NEMS structure.

Figure 1C:
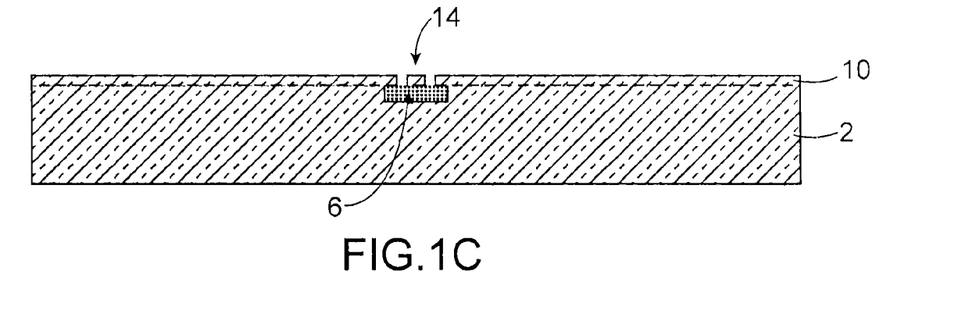

The element thus obtained is represented in FIG. 1C.

During a following step d), the withdrawing of the porous portion 6 is performed or otherwise only an oxidation of the same.

This withdrawing can be performed by means of a wet etching of porous silicon. This etching has the characteristic to etch porous silicon quicker than "non-porous" silicon, thus by controlling the etching time, the porous silicon is withdrawn whereas the suspended zone 14 has not been or very hardly etched. The duration of the etching can be between a few seconds and a few minutes, as a function of the concentration and the temperature of the etching solution used, which can be KOH, TMAH (Tetramethylammonium Hydroxide), . . . . Typically, the etching lasts a few minutes in a KOH solution at room temperature.

Alternatively, the withdrawing of porous silicon is achieved in two steps, first by performing a thermal oxidation and then by etching the formed oxide by a vapour and/or wet hydrofluoric acid etching. Porous silicon is much more quickly oxidized than "non-porous" silicon, thus by controlling the duration of the oxidation step, it is possible to oxidize only substantially porous silicon. For example, it is attempted to oxidize a silicon thickness of a few tens nm. The oxidation conditions are well known to those skilled in the art and will not be described in detail. According to this alternative, this etching can occur during the etching of the sacrificial layer which will be described in the following. The duration of the method can thus be advantageously reduced.

Figure 1D:
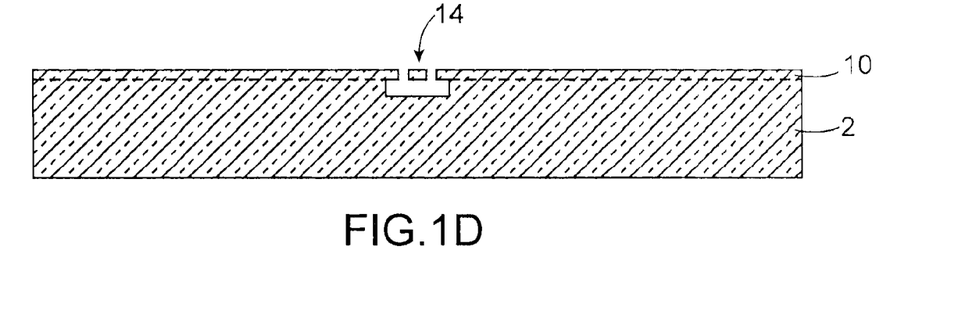

The element thus obtained is represented in FIG. 1D.

During a following step e), a deposition 16 is performed on the front face of the first substrate so as to completely or partly coat the first suspended zone 14 and to cover the front face of the first substrate. The material of the deposition 16 is selective towards silicon, it is for example of $SiO_2$. The layer 16 then forms a sacrificial layer. This layer 16 also enables the resulting cavities of the etching porous Si to be (wholly or partly) plugged. Advantageously, a slight thermal oxidation of silicon could be conducted, on a depth of a few 10 nm for example, before depositing this layer 16. The thermal oxide around the suspended zone 14 and in the cavity forms a stop layer and enables an increased protection to be ensured during step f) of machining. In the case where the porous silicon has been only oxidized, the coating is partial or only covers the first suspended zone 14.

A step of planarizing the oxide layer 16 can occur in the case where the topology or roughness of the surface obtained after depositing the layer 16 is too high. This planarization is for example performed by chemical-mechanical polishing.

Figure 1E:
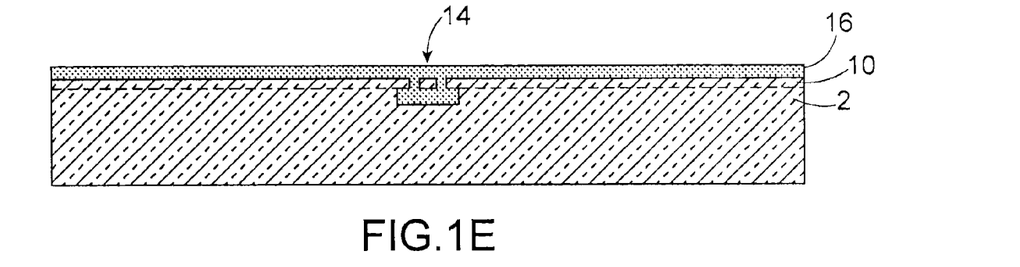

The element thus obtained is represented in FIG. 1E.

Advantageously, a support is then bonded or deposited onto the back face of the first substrate (step e'). In the example represented, the support is formed by a second substrate 18 of single crystal silicon bonded on the first substrate at the front face. The sacrificial layer 16 is then provided between the first substrate 2 and the second substrate 18.

The assembly is for example made by silicon direct bonding (SDB) which is a technique well-known to those skilled in the art. In the case of the deposition of the support or second substrate, this can be carried out by rolling.

The support could be of a material different from that of the first substrate, the use of a glass support for example of Pyrex® could even be contemplated.

Figure 1F:
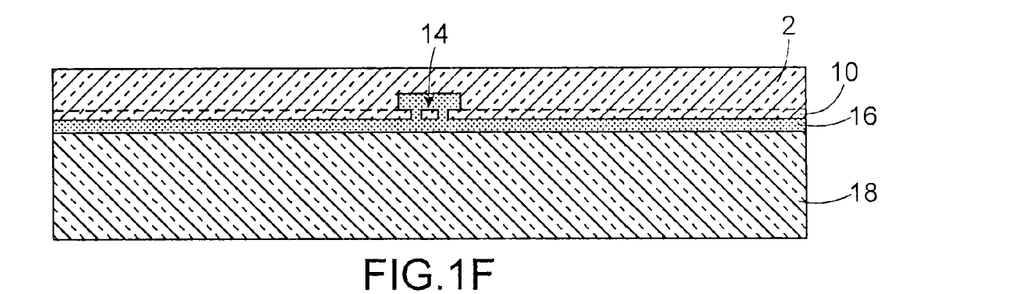

The element thus obtained is represented in FIG. 1F.

A thinning of the first substrate can be performed, for example by "back-grinding" and chemical-mechanical polishing.

This thinning enables the thickness of the MEMS part to be defined in the case of so-called MEMS&NEMS structures.

During the following step, a deposition of a metal layer is performed in order to make electrical contacts 20, at the back face of the first substrate 2, which forms the front face of the element obtained by bonded the first and second substrates.

A lithography step and then an etching step are performed to form the contacts 20.

During a step f), a lithography and an etching occur, of the deep reactive-ion etching (DRIE) type for example, of the first substrate 2 so as to clear the first suspended zone 14 and to make the second suspended zone 17, for example the MEMS part in the case of a so-called MEMS&NEMS structure. The etching reaches the sacrificial layer 16 and the porous silicon if it has not been withdrawn beforehand. The steps of structuring the first substrate are steps known to the MEMS&NEMS technology.

Figure 1G:
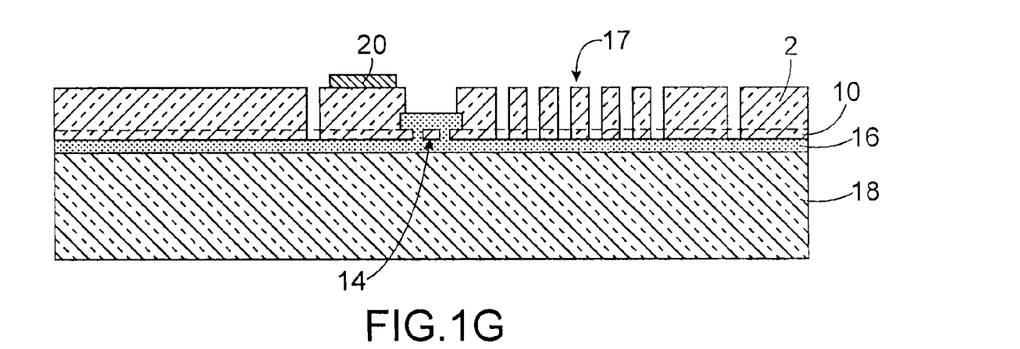

The element thus obtained is represented in FIG. 1G.

Figure 1H:
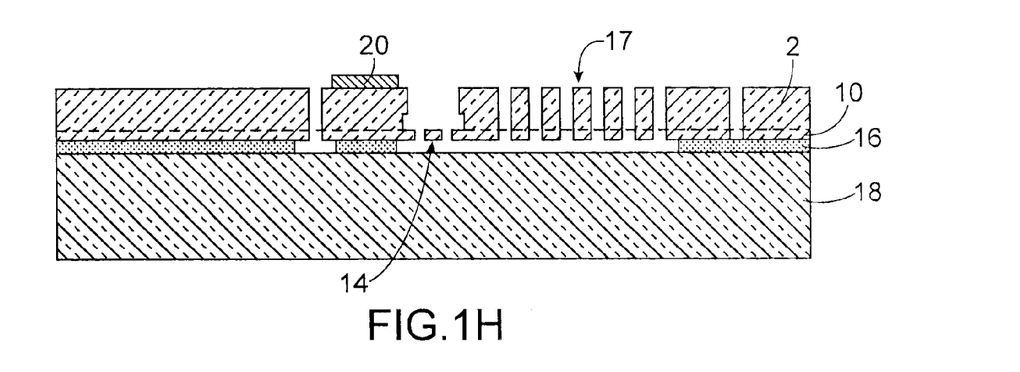

Finally, during a step g), the suspended zones 14, 17 are released for example by a wet or vapour phase etching of the sacrificial layer 16 and of the oxidized porous silicon, if any, using hydrofluoric acid. This is an etching over time (FIG. 1H).

Figure 2A:
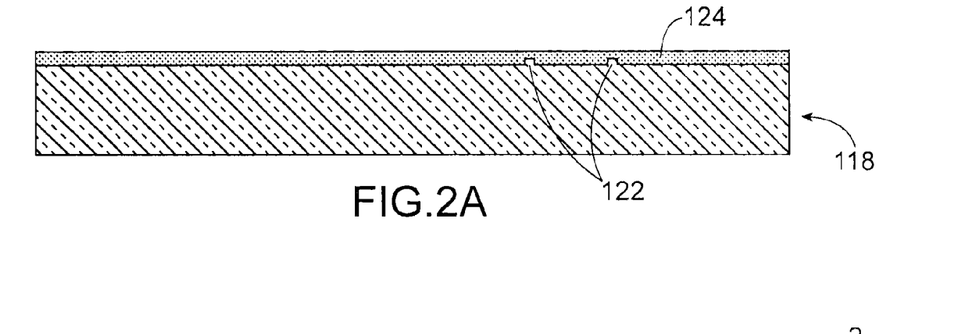
FIGS. 2A to 2C are schematic representations of different steps of making an alternative method of the first embodiment.
Figure 2B:
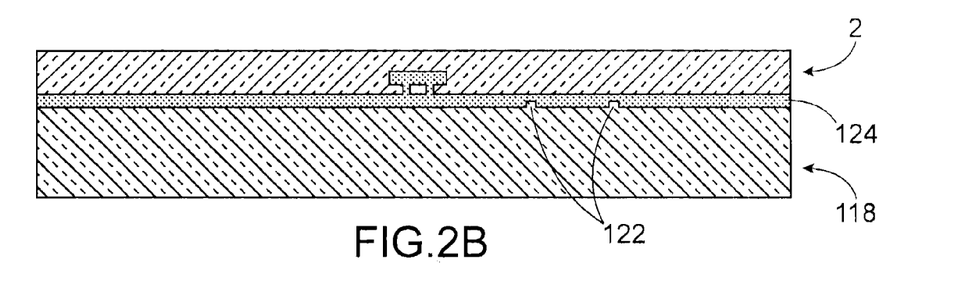
Figure 2C:
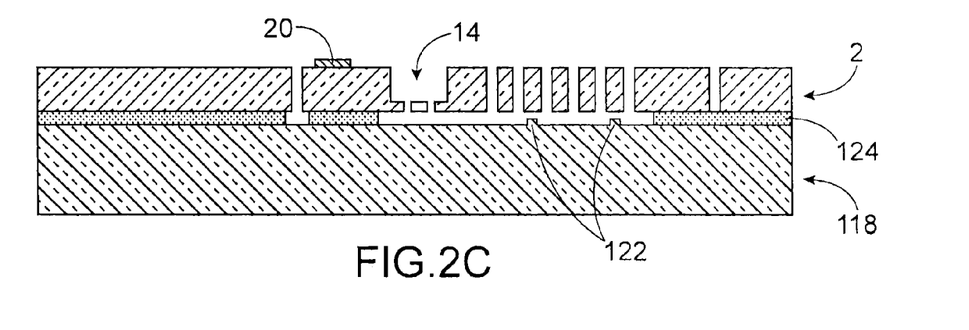

In FIGS. 2A to 2C, an alternative embodiment of the making method of FIGS. 1A to 1H can be seen, wherein the second substrate 118 is structured before its bonding on the first substrate.

Such a prior structuration can be performed for manufacturing CMOS circuits, in order to make a substrate provided with electrodes, for example for exciting the one or more active parts to form an electrical routing, form one or more cavities . . . .

The structuration of the second substrate 118 can be made in the following way. During a first step, a step of photolithography is performed to bound zones of the surface of the substrate to be etched and of etching the surface of the substrate on a depth for example of 0.5 µm. The etching is an etching with stop over time. Mechanical stops 122 are thus formed.

Then, a $SiO_2$ layer 124 is deposited onto the structured surface, this layer will form a bonding layer.

Finally, a step for planarizing the layer 26 is performed.

The element thus obtained is represented in FIG. 2A.

The bonding of the second structured substrate 118 and the first substrate 2 then occurs. The layer 24 is put into contact with the sacrificial layer 16, for example through direct bonding as previously described.

Then, a step of thinning the first substrate for example by "back-grinding" is performed, which enables for example the thickness of the MEMS part to be defined in the case of an MEMS&NEMS system.

The element thus obtained is represented in FIG. 2B.

Then, the electrical contacts are made in a similar manner as the method of FIGS. 1A to 1H.

Then, the first substrate 2 is structured in a similar manner as step f) and the suspended structures are released by hydrofluoric acid. During the release step, hydrofluoric acid etches the sacrificial layer 16 and the layer 26.

The element thus obtained is represented in FIG. 2C. In the example represented, the second substrate 118 comprises mechanical stops 22 downwards along the vertical direction in the representation of FIG. 2C made prior to the bonding with the first substrate.

In FIGS. 3A to 3E, another alternative of the making method according to the invention can be seen, wherein the sacrificial layer deposited onto the first substrate is structured before bonding and intermediate layers are deposited onto the structured sacrificial layer, before bonding.

During a first step, a step of lithography on the sacrificial layer 16 occurs to bound the zones 27 of the first layer 16 to be etched and a step of etching the layer 16 with stop on silicon, i.e. on the epitaxially grown silicon layer.

Figure 3A:
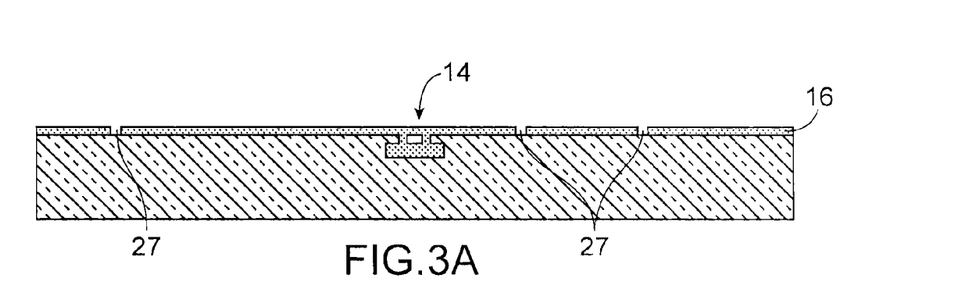
FIGS. 3A to 3E are schematic representations of different steps of making an alternative method of the first embodiment.

The element thus obtained is represented in FIG. 3A.

During a following step, a deposition of a polysilicon layer is performed to form, for example, a lower electrode 28.1 and an electrical routing 28.2.

A step of lithography then occurs on the layer 28 and a step of etching the layer 28 occurs with stop on the sacrificial layer 16.

During a following step, a deposition of a stop layer 30 is performed, for example of SiN which is selective towards $SiO_2$ during the release step.

Then, a bonding layer 32 is deposited onto the layer 30, for example of $SiO_2$.

Finally, a step of planarizing the layer 30 occurs, for example by chemical-mechanical polishing.

Figure 3B:
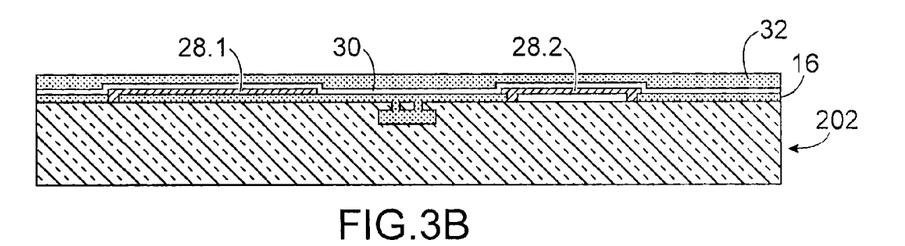

The first substrate 202 thus obtained is represented in FIG. 3B.

Figure 3C:
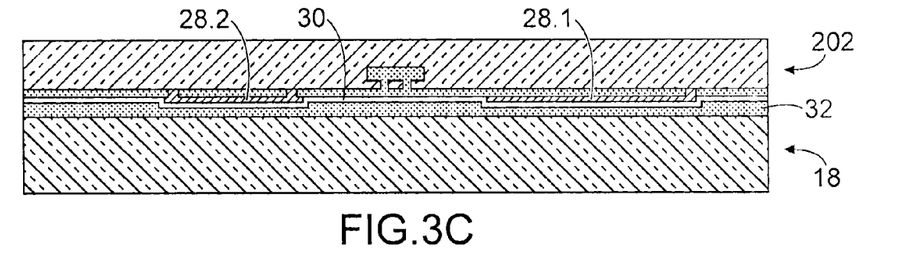

During a following step, the bonding of the first substrate 202 and the second substrate 18 or 118 occurs. The element thus obtained is represented in FIG. 3C.

A step of thinning the first substrate is then optionally performed, for example by "back-grinding" and then chemical-mechanical polishing.

Then, the electrical contacts 20 are made in a similar manner as the method of FIGS. 1A to 1H.

Figure 3D:
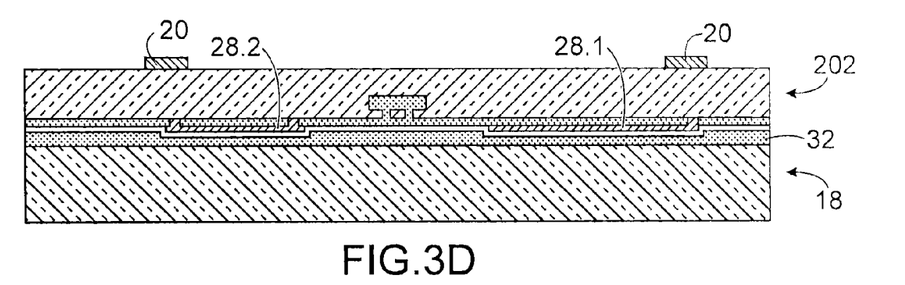

The element thus obtained is represented in FIG. 3D.

Then, the first substrate 2 is structured in a similar manner as step g) and the suspended structures are released by etching the sacrificial layer 16 by hydrofluoric acid.

Figure 3E:
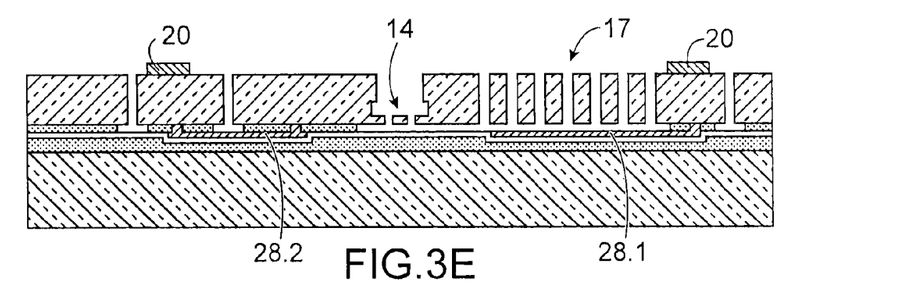

The element thus obtained is represented in FIG. 3E.

By virtue of the structuration of the sacrificial layer 16 and the deposition of the intermediate layers, a lower electrode formed by the portion 28.1 of polysilicon and an electrical routing formed by the polysilicon portion 28.2 for example can be made.

Alternatively, it can be contemplated either to only make a structuration of the sacrificial layer, or to deposit intermediate layers on a non-structured sacrificial layer.

Alternatively, it can be contemplated to machine the first substrate 2 before making the one or more porous silicon portions 6, for example to make a substrate provided with electrode, one or more electrical routings, one or more cavities. . . .

The possibility to thin the first substrate after bonding with the second substrate has been described. Alternatively, the first and second substrates can also be thinned after bonding or the second substrate only can be thinned.

It can also be contemplated to make several porous silicon portions and more generally a porous semi-conductor material having different depths, these different depths being obtained by successive porosification steps.

Further, the method according to the invention enables more than two thicknesses to be made, by repeating steps a) to e), the intermediate sacrificial layers, i.e. those not used as an interface layer during bonding, are then machined according to defined patterns, before epitaxy.

An example of such a method will now be described, steps of which are schematically shown in FIGS. 4A to 4E.

During a first step, on a face of a substrate 402 of single crystal semi-conductor, for example of silicon, a porous silicon layer 403 which extends on the entire surface of the substrate is made. The porous layer 403 is obtained for example by porosification through electrochemical etching. This etching is an etching over time. The thickness of the silicon made porous is between 0.5 µm and a few tens µm, advantageously it is equal to about 5 µm.

Then, a single crystal silicon layer 405 is made by epitaxial growth on the entire porous layer 403. This layer has for example a thickness between 1 µm and a few tens pm. The thickness of this layer defines the thickness of the MEMS part in a MEMS&NEMS structure.

Figure 4A:
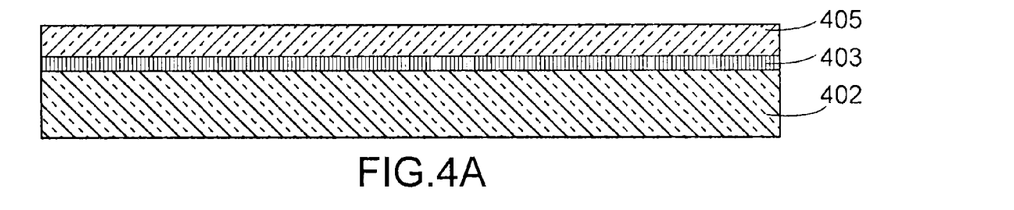
FIGS. 4A to 4E are schematic representations of different steps of making an alternative method of the first embodiment.

The element thus obtained is represented in FIG. 4A.

During a following step, a porous silicon zone 406 is made in a similar way as step a) of the method represented in FIGS. 1A to 1H, by lithography for example by means of a SiN type mask and porosification.

Then, a silicon layer of a semi-conductor 410 is formed by epitaxy, this being a single crystal one onto at least the porous zone 406. The layer 410 has a thickness between about a few hundreds nm and a few tens µm.

The thickness of this layer defines for example the thickness of the NEMS part in a MEMS&NEMS structure.

Figure 4B:
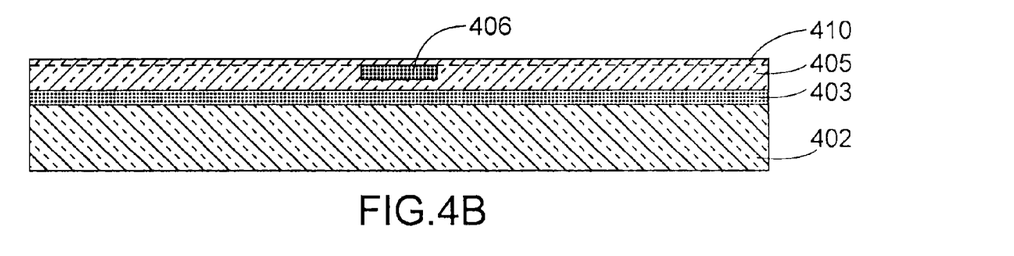

The element thus obtained is represented in FIG. 4B.

Figure 4C:
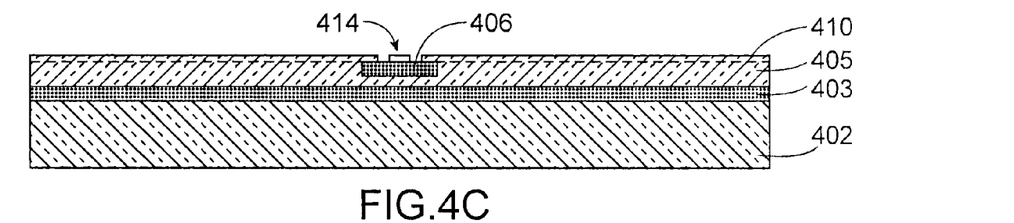

During a following step, a lithography is performed to bound a first suspended structure 414 above the porous zone 406, and then an etching is performed, for example of the DRIE type up to open into the porous zone 406. The element thus obtained is represented in FIG. 4C.

Then, a removal of the porous silicon of the zone 406 is performed in a similar way to the method described in connection with FIGS. 1A to 1H, for example through etching.

During a following step, a deposition 416 is made on the front face of the first substrate so as to completely or partly coat the first suspended zone 114 and to cover the front face of the first substrate. The material of the deposition 16 is selective towards silicon, it is for example of SiO$_2$. The layer 16 then forms a sacrificial layer.

A step of planarizing the oxide layer 16 can occur in the case where the topology or roughness of the surface obtained after depositing the layer 16 is too high. This planarization is for example performed by chemical-mechanical polishing.

During a following step, a support is bonded or deposited at the back face of the first substrate.

In the example represented, the support is formed by a second substrate 118 of single crystal silicon bonded on the first substrate at the front face. The assembly is made for example by silicon direct bonding (SDB) which is a technique well known to those skilled in the art. In the case of the deposition of the support or second substrate, this can be made by rolling.

Figure 4D:
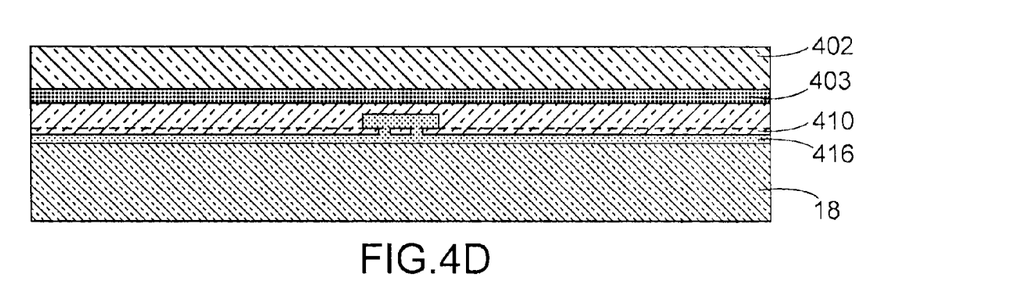
Figure 4E:
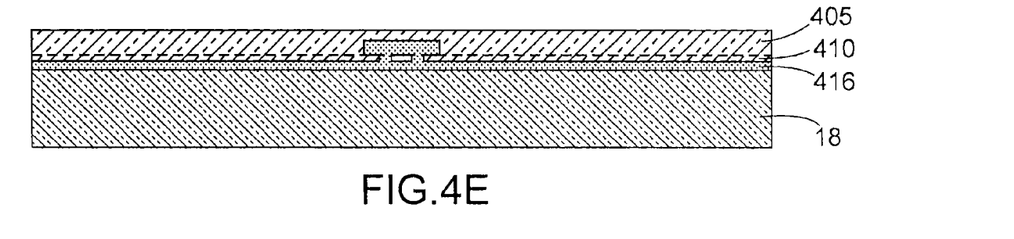

The element thus obtained is represented in FIG. 4D.

Then, an etching of the porous silicon layer 105 is performed, for example by wet etching; the part of the substrate located opposite the first suspended element with respect to the porous element 105 can then be withdrawn. A thinning of the first substrate is thereby obtained.

The following steps are not represented, however, they are similar to the steps represented in FIGS. 1G and 1H.

This method offers the advantage to provide a good control on the MEMS thickness by epitaxy.

The alternatives to the method according to the invention are not exclusive to each other and can be combined.

In FIGS. 5A to 5D, the first steps of a second embodiment of the method according to the invention can be seen, which differs from the first embodiment in that it is no longer formed by a zone wherein the semi-conductor is porous but by a zone formed by a plurality of thin pillars and provided a short distance apart from each other.

The pillars have for example a width between about 0.5 µm and 2 µm and are provided a distance apart from each other between about 0.3 µm and 1 µm.

A first substrate 302 of single crystal silicon wherein the active part will be made is used.

During a first step, a mask is made by photolithography on the surface of the substrate 302. Where the zone formed by pillars should be made, the mask defines for example a honeycomb network such as represented viewed from above in FIG. 6.

This mask bounds the interpillar zones to be etched. The width d of the interpillar zones is for example between 0.3 µm and 1 µm and the distance D between two parallel faces of the pillar is for example between 0.5 µm and 2 µm. The width d and the distance D are represented in FIG. 5A'.

A step of etching the substrate 302 then occurs, for example by DRIE type with stop over time, on a depth typically between 0.5 µm and 2 µm.

Figure 5A:
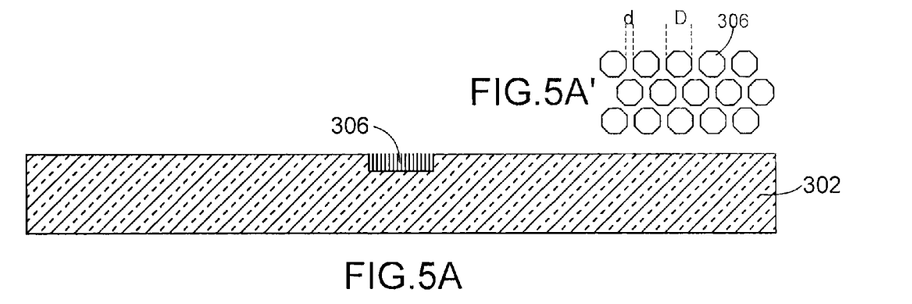
FIGS. 5A to 5D and 5A' are schematic representations of the first steps of a making method according to a second embodiment.

Then, the element schematically represented in FIG. 5A is obtained, the silicon portion formed by pillars is designated by reference 306 (detailed view).

During a following step, the mask is withdrawn.

And then occurs a step of epitaxially growing a single crystal silicon layer 310 on the entire surface of the substrate 302 and on the top of the pillars of the portion 306. The layer thus formed has a thickness typically between 1 µm and a few tens µm. The epitaxially grown layer 310 closes the zone 306.

For example, the epitaxial growth is performed in a deoxidizing environment, for example under an atmosphere having a high hydrogen concentration, using preferably trichlorosilane SiHCl$_3$. An epitaxially grown layer 310 grows on the surface of the pillars and closes the cavity wherein the pillars are located.

Figure 5B:
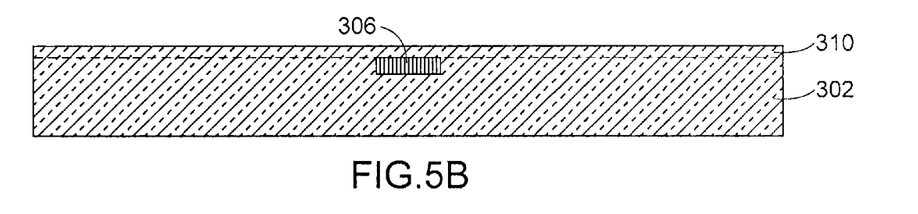

The element schematically represented in FIG. 5B is then obtained.

After epitaxy, a high temperature annealing at a temperature close to the melting temperature of said material in the case of SiN pillars is performed, the temperature is about 1200° C., which causes the pillars to collapse. Then, a suspended membrane 307 is formed above the zone 306. A planarization by chemical-mechanical polishing can be made to improve the surface condition and possibly thin the thickness of this membrane.

Figure 5C:
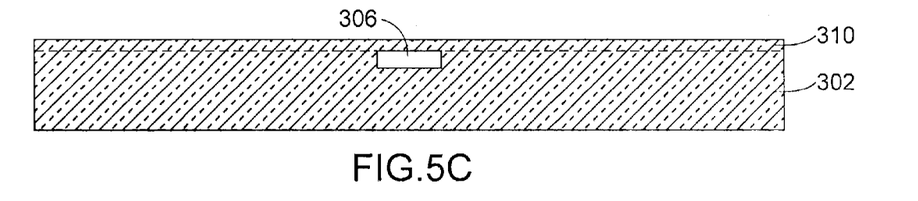

The element thus obtained is represented in FIG. 5C.

During a following step, the first suspended zone 314 is defined. For this, a lithography occurs to make a mask on the surface of the layer 310 and then an etching of the portion 312 with stop in the cavity.

The etching is for example a deep reactive-ion etching (DRIE).

Figure 5D:
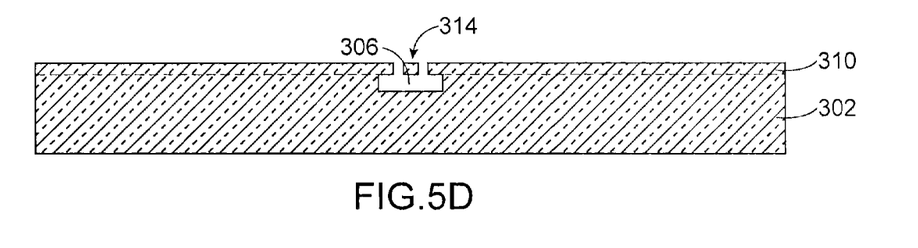

The first suspended zone forms the NEMS part in the case of the so-called M&NEMS structure (FIG. 5D).

Figure 6A:
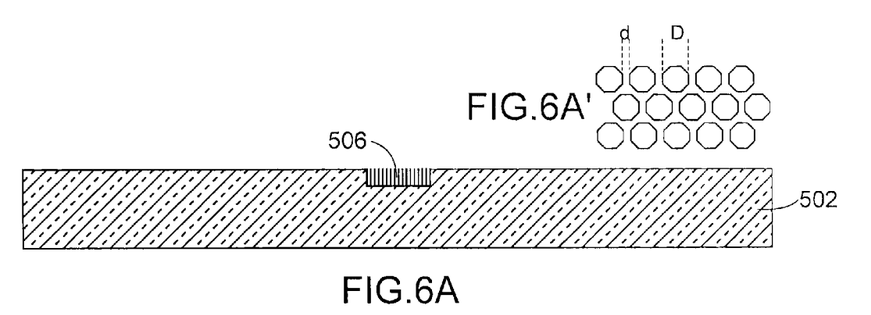
FIGS. 6A to 6E and 6A' are schematic representations of the first steps of an alternative making method according to a second embodiment.

Alternatively and as is represented in FIGS. 6A to 6E, a partial suppression of the pillars can be contemplated by conducting a thermal oxidation of these pillars. FIG. 6A' represents a top view of the element of FIG. 6A.

Figure 6B:
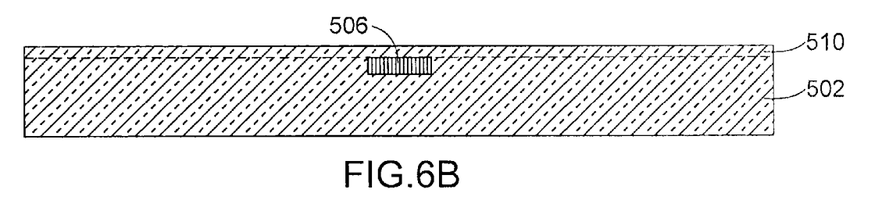

The steps represented in FIGS. 6A and 6B are similar to those represented in FIGS. 5A and 5B and will not be described.

Figure 6C:
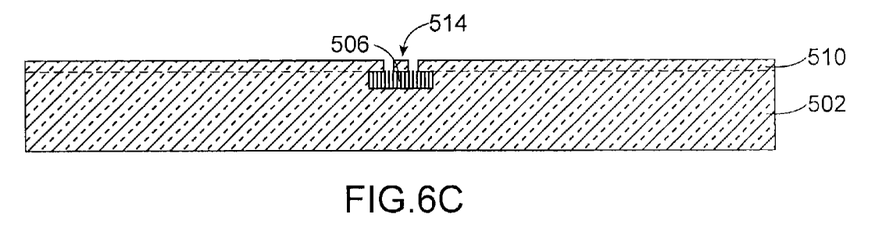

After the epitaxy growth, a lithography and an etching, for example through DRIE, of the epitaxially grown layer 510 above the pillars are perfomed, to define a first suspended structure, for example the NEMS part in MEMS and NEMS technology up to open into the cavity enclosing the pillars. The element thus formed is represented in FIG. 6C.

During a following step, a high temperature annealing step is performed, which is sufficient to completely oxidize the pillars. An oxide layer 513 is also formed on the entire surface of the element.

It is worth of note that during this step, the NEMS part is also oxidized, which causes during the deoxidation step a decrease in its cross-section.

Figure 6D:
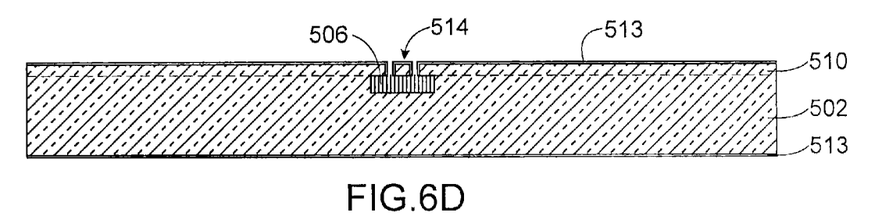

This decrease in cross-section can be anticipated by suitably selecting the size of the NEMS etching mask and the thickness of the epitaxially grown layer. The element thus formed is represented in FIG. 6D.

Figure 6E:
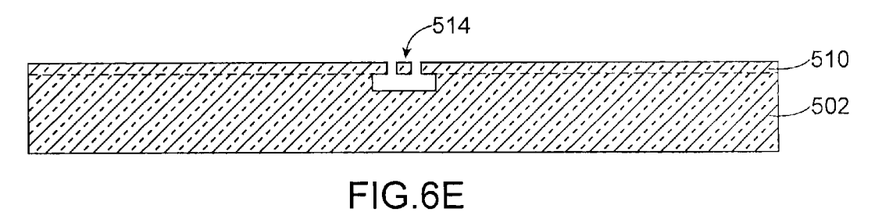

During a following step, the oxide is removed by wet or vapour etching for example by means of hydrofluoric acid. The pillars are then suppressed. The element thus formed is represented in FIG. 6E.

The following steps are similar to those described in the first embodiment and will not be described herein.

This alternative is particularly interesting in the case where the pillars are sufficiently thin, for example in the case where they have a side of 0.6 and are spaced apart from 0.3 μm.

The alternatives set forth in connection with the method according to the first embodiment are entirely applicable to the method of the second embodiment.

By virtue of the method according to the invention, it is possible not to resort to the use of SOI substrate and no longer perform a thick epitaxy. A cost and time gain is then achieved. The duration of the method is also reduced because it is no longer necessary to perform an important chemical-mechanical polishing step after epitaxy to make up for thickness differences between the single crystal and polycrystalline zones.

It is also possible to functionalize a sacrificial layer, as has been previously described to form one or more lower electrodes, a ground plane connected to the MEMS layer, one or more anti-bonding stops, . . . .

It is also possible by virtue of the method according to the invention to make several layers having different thicknesses by alternating several steps of forming a porous semi-conductor and epitaxially growing a semi-conductor, possibly combined with intermediate steps of lithography and etching.

It is also possible to perform a CMOS co-integration in three dimensions. In this case, the second substrate is replaced by a CMOS substrate.

The recovery of the contacts can be made by vias or TSV (Through-silicon vias) or during bonding, by a eutectic in this case, for example of the AlGe type, which are techniques well known to those skilled in the art.

The method according to the invention is particularly adapted to making microelectromechanical sensors and actuators and/or nanoelectromechanical systems.

The invention claimed is:

1. A method for making a structure comprising an active part comprising at least two layers from a first substrate comprising a first face of single crystal semi-conductor material, called the front face, and a second face opposite the first face, called the back face, said method comprising the steps of:
   a) making at least one zone of discontinuous semi-conductor material in the first substrate from the front face of single crystal semi-conductor material,
   b) making an epitaxial growth deposition of a layer from a semi-conductor material onto the front face of the first substrate, said layer being at least a single crystal one on the surface of the zone of discontinuous semi-conductor material,
   c) machining the epitaxially grown single crystal layer at least at the zone of discontinuous semi-conductor material to make a first suspended zone,
   d) removing or oxidizing the discontinuous semi-conductor material,
   e) forming a sacrificial layer being selectively etchable with respect to said semi-conductor material of the front face and to the material of the epitaxially grown semi-conductor layer so as to completely or partly coat the first suspended zone,
   f) machining the back face of the first substrate up to clear some zones from said sacrificial layer to define a second suspended zone and to enable the first suspended zone to be reached,
   g) releasing the first and second suspended zones by withdrawing at least one part of the sacrificial layer.

2. The method according to claim 1, wherein the epitaxial growth step is made in the same material as the semi-conductor material of the front face of the first substrate or in another semi-conductor material preferably having a lattice parameter close to that of the material of said face.

3. The method according to claim 1, wherein forming the sacrificial layer is achieved by depositing an oxide and/or by thermal oxidation.

4. The method according to claim 1, wherein it further comprises after step e) and before step f), a step e') of bonding or depositing a second substrate onto the front face of the first substrate.

5. The making method according to claim 1, wherein during step a), a zone of porous semi-conductor material is made.

6. The making method according to claim 5, wherein the zone of porous semi-conductor material is achieved by electrochemical etching.

7. The making method according to claim 5, wherein the zone of porous semi-conductor material comprises the size of pores on the surface is smaller than the size of the pores in depth.

8. The making method according to claim 5, wherein during step d), removing the porous semi-conductor material is made by etching, for example by wet etching.

9. The making method according to claim 5, wherein several zones of porous semi-conductor material are made, the latter having different depths.

10. The making method according to claim 5, wherein during step d), removing the porous semi-conductor material is performed by thermally oxidizing the porous semi-conductor material and by etching the oxidized porous semi-conductor material, for example by wet etching and/or vapour.

11. The making method according to claim 1, wherein during step a), a zone of semi-conductor material is made comprising a plurality of small cross-sectional area pillars and provided a short distance apart from each other.

12. The making method according to claim 11, wherein step a) comprises:
a step of forming a mask bounding pillars,
a step of etching interpillar zones,
a step of withdrawing the mask.

13. The making method according to claim 11, wherein during step d), removing the semi-conductor material forming pillars is achieved by annealing at a temperature close to the melting temperature of said material.

14. The making method according to claim 1, wherein it further comprises after step e) and before step f), a step e') of bonding or depositing a second substrate onto the front face of the first substrate and prior to step e'), a step of structuring the second substrate.

15. The making method according to claim 14, wherein, during the structuring step, a face of the second substrate is etched so as to make mechanical stops for the second suspended part and a deposition is performed on said structured face of a layer intended to form a bonding layer during the bonding step of the second substrate.

16. The making method according to claim 1, comprising, following step e), the step of structuring the sacrificial layer and/or depositing one or more intermediate layers on said sacrificial layer, wherein said intermediate layers can be structured.

17. The making method according to claim 16, wherein the structurations of the sacrificial layer and of the one or more intermediate layers are performed through lithography and etching respectively of the sacrificial layer with stop on the substrate and the one or more intermediate layers with stop on the sacrificial layer.

18. The making method according to claim 16, comprising a step of depositing a $SiO_2$ layer, planarizing on the structured sacrificial layer and/or the one or more intermediate layers, said $SiO_2$ layer taking part in the bonding.

19. The making method according to claim 1, wherein it further comprises after step e) and before step f), a step e') of bonding or depositing a second substrate onto the front face of the first substrate and wherein the bonding of the first and second substrates is achieved by direct bonding or eutectic bonding.

20. The making method according to claim 1, wherein the first substrate is structured before step a).

21. The making method according to claim 4 wherein after step e'), the first substrate and/or the second substrate is/are thinned down by back-grinding the back face, and then chemical-mechanical polishing and wherein it further comprises after step e) and before step f), a step e') of bonding or depositing a second substrate onto the front face of the first substrate.

22. The making method according to claim 1, comprising prior to step a), a step of forming on the front face of the substrate a porous semi-conductor layer and epitaxially growing on said porous semi-conductor layer a single crystal semi-conductor layer, said single crystal semi-conductor layer forming the front face from which the discontinuous porous zone is formed.

23. The making method according to claim 22, wherein, following the bonding, the porous semi-conductor layer is etched so as to thin down the first substrate and wherein it further comprises after step e) and before step f), a step e') of bonding or depositing a second substrate onto the front face of the first substrate.

24. The making method according to claim 1, wherein step f) of machining for making a second suspended zone and machining to afford the first suspended zone is achieved by simultaneously machining the first substrate at said zones or by successively machining at each of these zones.

25. The making method according to claim 1, wherein steps a) to e) are repeated in order to make an active part having more than two layers.

26. The making method according to claim 4, wherein the semi-conductor material of the front face of the first substrate, the second substrate and the epitaxially grown layer are of silicon.

27. The method according to claim 1, for making micro-electromechanical and/or nanoelectromechanical structures for making sensors and/or actuators.

* * * * *